United States Patent
Nedovic (10) Patent No.: US 8,139,701 B2
(45) Date of Patent: Mar. 20, 2012

(54) PHASE INTERPOLATION-BASED CLOCK AND DATA RECOVERY FOR DIFFERENTIAL QUADRATURE PHASE SHIFT KEYING

(75) Inventor: Nikola Nedovic, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/851,252

(22) Filed: Aug. 5, 2010

(65) Prior Publication Data
US 2012/0033773 A1    Feb. 9, 2012

(51) Int. Cl.
*H04L 7/00* (2006.01)
(52) U.S. Cl. ........ 375/371; 375/373; 375/375; 375/376; 375/324; 375/327; 375/329; 375/340
(58) Field of Classification Search ............ 375/371, 375/373, 375, 376, 324, 327, 329, 340
See application file for complete search history.

(56) References Cited

U.S. PATENT DOCUMENTS

| 5,535,252 A * | 7/1996 | Kobayashi | 375/371 |
| 5,625,652 A * | 4/1997 | Petranovich | 375/355 |
| 5,828,707 A * | 10/1998 | Urabe et al. | 375/330 |
| 2007/0047972 A1 | 3/2007 | Ikeuchi | |

* cited by examiner

*Primary Examiner* — Kibir A Timory
(74) *Attorney, Agent, or Firm* — Baker Botts L.L.P.

(57) ABSTRACT

In one embodiment, a method includes receiving N input streams; generating a recovered clock signal based on the input data bits in the N input streams, the recovered clock signal having a clock frequency and a recovered clock phase; generating a clock signal for each one of the N input streams based on the recovered clock signal having the clock frequency and a respective phase at a respective phase offset relative to the recovered clock phase; detecting a phase difference between each of the N input bit streams and the respective N clock signals; and adjusting the phases of the N clock signals to eliminate the respective phase differences, the adjusting comprising shifting the N respective clock phase offsets such that each of the N clock signals is locked to the input data bits in the respective one of the N input streams.

26 Claims, 4 Drawing Sheets

CASE 1:

FIG. 4A

CASE 2:

FIG. 4B

CASE 3:

PHASE INTERPOLATION-BASED CLOCK AND DATA RECOVERY FOR DIFFERENTIAL QUADRATURE PHASE SHIFT KEYING

TECHNICAL FIELD

The present disclosure relates generally to clock and data recovery (CDR).

BACKGROUND

CDR circuits (or systems) are generally used to sample an incoming data signal, extract (or recover) the clock from the incoming data signal, and retime the sampled data to produce one or more recovered data bit streams. A phase-locked loop (PLL)-based CDR circuit is a conventional type of CDR circuit. A PLL circuit is an electronic control system that may be used, in part or in whole, to generate or maintain one signal that is locked onto the phase and frequency of another signal. By way of example, in a conventional PLL-based CDR, a phase detector compares the phase between input data bits from a serial input data stream and a clock signal generated by a voltage-controlled oscillator (VCO). In response to the phase difference between the input data and the clock, the phase detector generates phase or frequency correction signals. A charge pump drives a current to or from a loop filter according to the correction signals. The loop filter outputs a control voltage $V_{CTRL}$ for the VCO based on the current driven by the charge pump. The loop acts as a feedback control system that tracks the phase and frequency of the input data stream with the phase and frequency of the clock that the loop generates.

One significant problem with conventional CDR systems comprising two CDR circuits that each receive a respective input data bit stream is that such CDR systems are suitable only for full-rate CDR within each individual CDR circuit without data demultiplexing; that is, when the frequencies of the recovered clock signals generated for each input data bit stream and the data rates (or frequencies) of the recovered data bit streams generated for each input data bit stream share the same frequency or rate as the respective input data bit streams. Otherwise, there exists an uncertainty in the relative clock and data phases from each CDR circuit and the system may operate erroneously. Unfortunately, many, or even most, practical CDR systems in, for example, high speed optical communication applications, use either half-rate or quarter-rate CDR architectures, or demultiplex each of the input data bit streams to two, four, or more individual streams to, for example, cope with high input data rates.

DESCRIPTION OF EXAMPLE EMBODIMENTS

Particular embodiments relate to an electronic circuit, device, system, or method for clock and data recovery (CDR) for a serial communication system application. More particularly, the present disclosure provides examples of a CDR architecture that receives two or more input data bit streams, generates a clock signal for each of the input data bit streams based on the input data bits in the input data bit streams, recovers the data bits in each of the input data bit streams, and outputs a recovered data bit stream for each input data bit stream with the recovered bits from the respective input data bit stream. In some embodiments, the CDR architecture then combines the recovered data bits from the recovered data bit streams and outputs one or more output data bit streams in which the recovered bits from the two or more input data bit streams are interleaved. By way of example, in one example embodiment, the CDR architecture receives two input data bit streams each of which is generated by demodulating or decoding a single symbol stream such as, for example, a Differential Quadrature Phase Shift Keying (DQPSK)-modulated symbol stream in which each symbol encodes two bits of data. In such example embodiments, the CDR architecture may recombine the recovered data bits from the input data bit streams to output one or more output data bit streams that reconstruct the values and ordering of the bits in the original DQPSK-modulated symbol stream from which the two input data bit streams were generated.

Generally, various described embodiments can be used for any N-input CDR application; however, particular embodiments relate to the use of a CDR architecture within a deserializer utilized in optical communication. By way of example, particular embodiments may be utilized in a DQPSK optical transponder. In particular embodiments described below with reference to a two-input CDR architecture, the two input data bit streams have the same data rate and are each generated by demodulating or decoding a DQPSK-modulated symbol stream in which each symbol of the DQPSK symbol stream encodes two data bits (e.g., binary data bits). However, alternative embodiments may be utilized in other specific applications and for non-optical communication (e.g., hard-wired communication using electrons), where appropriate. Particular embodiments may be utilized in high speed communication systems (e.g., data bit rates greater than 10 Gigabits per second (Gb/s)) and in even more particular embodiments, in communication systems having data rates at or exceeding 20 Gb/s or 40 Gb/s. Particular embodiments may be implemented with a complementary metal-oxide-semiconductor (CMOS) architecture. As used herein, one stream may refer to one wire, and vice versa, where appropriate, or alternately, one stream may refer to one bus (e.g., multiple wires or communication lines), and vice versa, where appropriate. Furthermore, as used herein, "or" may imply "and" as well as "or;" that is, "or" does not necessarily preclude "and," unless explicitly stated or implicitly implied.

Figure 1:
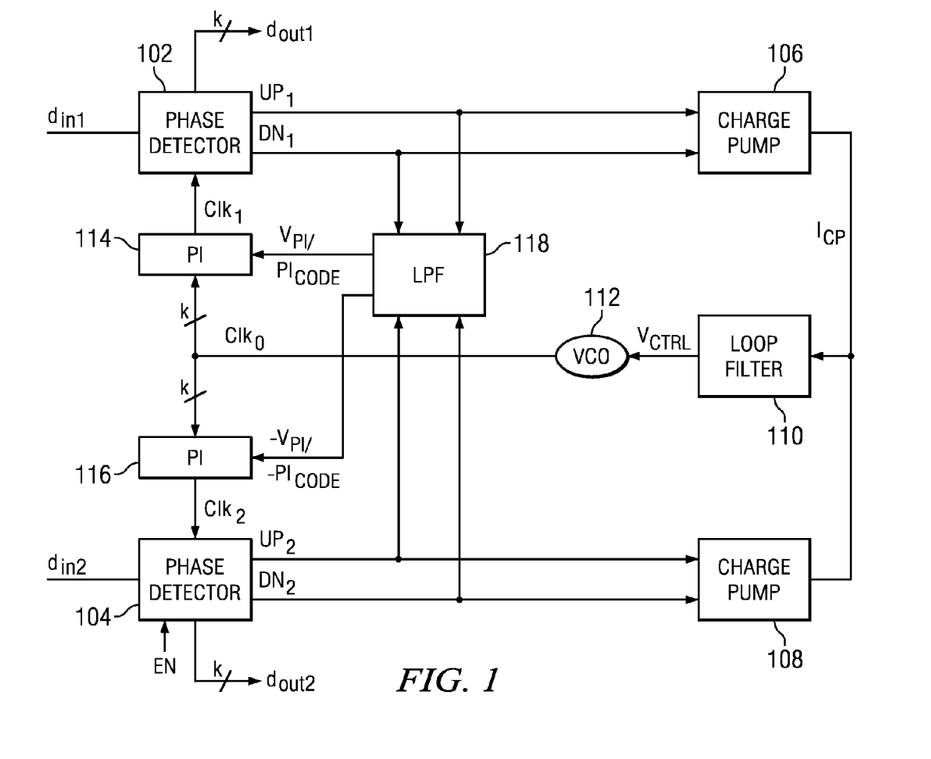
FIG. 1 illustrates an example CDR architecture.

FIG. 1 illustrates an example CDR architecture, system, device, or circuit 100 ("CDR 100"). CDR 100 is configured to receive first input data bits from a first input data bit stream $d_{in1}$ and second input data bits from a second input data bit stream $d_{in2}$. In particular embodiments, the first and the second input data bit streams $d_{in1}$ and $d_{in2}$ are generated by demodulating or decoding a single symbol stream, and each includes input data bits at an input data bit frequency (in this example, the input data bit frequency is half the symbol frequency of the stream from which the two input data bit streams were generated). In particular embodiments, the symbol stream is a DQPSK-modulated data stream. In particular embodiments, and as described in the present disclosure, the first input data bits in the first input data bit stream $d_{in1}$ may be even-numbered bits from the DQPSK symbol stream while the second input data bits in the second input data bit stream $d_{in2}$ may be odd-numbered bits from the DQPSK symbol stream (or vice versa); that is, for example, the first bit of each demodulated symbol from the DQPSK symbol stream may be output to the first input data bit stream $d_{in1}$ while the second bit of each demodulated symbol from the DQPSK symbol stream may be output to the second input data bit stream $d_{in2}$. In particular embodiments, each of first and second input data bit streams $d_{in1}$ and $d_{in2}$ is transmitted in the form of a differential signal (e.g., a signal that is formed by the difference of a data signal and its complement).

Figure 2:
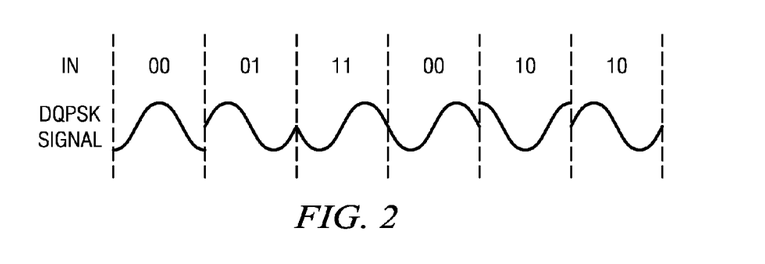
FIG. 2 illustrates an example differential quadrature phase shift keying (DQPSK) modulation scheme.

DQPSK is a modulation technique in which two bits at a time are grouped and used to phase-modulate an output. By way of example, in an example implementation, two bits per symbol are encoded in the phases of light. The modulation is differential, which means that the input symbol (two bits) corresponds not to a particular phase of the output, but to the change of the phase relative to the phase of the previous symbol. FIG. 2 illustrates an example DQPSK modulation scheme. In the example illustrated in FIG. 2, symbol 00 causes zero change in the output phase, symbol 01 causes a phase change of $\pi/2$, symbol 11 causes a phase change of $\pi$, and symbol 10 causes a phase change of $3\pi/2$. In this way the demodulation may be made insensitive to a phase shift in the communication medium.

Figure 3:
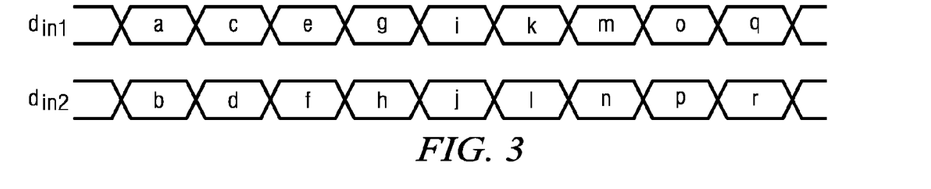
FIG. 3 illustrates two example input data streams obtained by demodulating a DQPSK-modulated input signal.

A DQPSK receiver demodulates the DQPSK symbol stream to obtain two bits per symbol, and thus two streams of binary data, $d_{in1}$ and $d_{in2}$, which may then be amplified and sent to CDR 100. The two input data streams $d_{in1}$ and $d_{in2}$, examples of which are illustrated in FIG. 3 for didactic purposes (in which each bit is represented by a letter), have the same data rate (input data bit frequency), but the exact phase relationship between the two input data streams $d_{in1}$ and $d_{in2}$ is unknown due to, for example, mismatches in the paths from the DQPSK demodulator to CDR 100. A proper CDR circuit should not only recover the clock and individual data from the input data bit streams, but also correctly recombine the recovered bits from the two input data bit streams; that is, in particular embodiments, determine which bits from $d_{in1}$ and $d_{in2}$ correspond to the same corresponding symbols from the DQPSK symbol stream and output these bits in the proper order as they were received from the DQPSK symbol stream. By way of example, referring to the example data bits illustrated in FIG. 3, the recovered and recombined bits should be ordered as a, b, c, d, e, f, g, and so on.

In the embodiment illustrated in FIG. 1, CDR 100 includes a primary feedback loop that comprises phase detectors (PDs) 102 and 104, charge pumps (CPs) 106 and 108, loop filter 110, voltage-controlled oscillator (VCO) 112, and phase interpolators (PIs) 114 and 116. In particular embodiments, CDR 100 additionally includes two local loops each with complementary outputs, one for each input to the respective one of the phase interpolators 114 or 116, which set the control of the respective phase interpolators 114 and 116, which generate clock signals $Clk_1$ and $Clk_2$, respectively. In particular embodiments, after a number of iterations or short time period, the recovered data in recovered data bit streams $d_{out1}$ and $d_{out2}$ are synchronous to their local clock signals $Clk_1$ and $Clk_2$, respectively, and should thus subsequently be synchronized to the global clock signal, which may be $Clk_1$, $Clk_2$, or $Clk_0$, as described below. Of particular note, the embodiments illustrated and described with reference to FIG. 1 do not restrict the rate of CDR 100; that is, in general, CDR 100 may be a ½K-rate CDR (e.g., where K is 1, 2, 4 or some other desired number), where each of phase detectors 102 and 104 demultiplex the input data bit streams $d_{in1}$ and $d_{in2}$, respectively, into K individual streams. In such embodiments, each of the K data bit streams generated by demultiplexing the respective input data bit stream $d_{in1}$ or $d_{in2}$ are at 1/K the data rate of the respective input data bit stream $d_{in1}$ or $d_{in2}$, and the frequencies of each of the recovered clocks ($Clk_0$, $Clk_1$, and $Clk_2$) are at 1/K the frequency or data rate of each of input data bit streams $d_{in1}$ and $d_{in2}$. Furthermore, in such embodiments, the recovered data bit streams $d_{out1}$ and $d_{out2}$ may then comprise K individual streams each comprising selected ones of the recovered bits from the demultiplexed input data bit streams $d_{in1}$ and $d_{in2}$, respectively, at 1/K the data rate of the respective input data bit stream $d_{in1}$ or $d_{in2}$. In alternate notation, the recovered data bit stream $d_{out1}$ may be written as $D_{out1}[1, 3, 5, \ldots 2K-1]$, where each number in the brackets corresponds to a corresponding one of the recovered K bits (per K-bit data cycle of $d_{in1}$ and, thus, 2K-bit cycle of the original symbol stream from which $d_{in1}$ was generated) from a corresponding individual one of the K recovered data bit streams that collectively comprise $d_{out1}$. Similarly, in alternate notation, the recovered data bit stream $d_{out2}$ may be written as $D_{out2}[2, 4, 6, \ldots 2K]$, where each number in the brackets corresponds to a corresponding one of the recovered K bits (per K-bit data cycle of $d_{in2}$ and, thus, 2K-bit cycle of the original symbol stream from which $d_{in2}$ was generated) from a corresponding individual one of the K recovered data bit streams that collectively comprise $d_{out2}$.

In one example embodiment, each of phase detectors 102 and 104 comprises a sampler or sampling circuit for sampling each of the input data bits received from the input data bit streams $d_{in1}$ and $d_{in2}$, respectively, based on the generated clock signals $Clk_1$ and $Clk_2$, respectively. Phase detectors 102 and 104 then output recovered data bit streams $d_{out1}$ and $d_{out2}$, respectively, based on the sampled bits from input data bit streams $d_{in1}$ and $d_{in2}$, respectively. In one embodiment, each of phase detectors 102 and 104 oversamples the respective input data bit stream $d_{in1}$ or $d_{in2}$ by a factor of n. In such embodiments, each of phase detectors 102 and 104 may comprise a selector or selecting circuit for selecting one of the oversampled bits sampled by the respective sampler for output to recovered output bit stream $d_{out1}$ or $d_{out2}$, respectively (e.g., the sample that best corresponds to the center of the eye of the respective data bit). Additionally, although each of phase detectors 102 and 104 are illustrated as a single circuit block or element, each of phase detectors 102 and 104 may generally include one or more individual circuits or circuit elements, respectively. More generally, each of phase detectors 102 and 104, as well as any other component of CDR 100 described herein, may comprise any suitable components or devices of hardware or logic or a combination of two or more such components or devices operable to perform or carry out the embodiments described herein.

In particular embodiments, phase detectors 102 and 104 detect (or determine) phase differences between $d_{in1}$ or $d_{in2}$, respectively, and the clock signal $Clk_1$ or $Clk_2$, respectively, as FIG. 1 illustrates. In embodiments in which each of the input data bit streams $d_{in1}$ and $d_{in2}$ are demultiplexed to K individual streams, the clock signals $Clk_1$ and $Clk_2$ may each be multi-phase clock signals (e.g., K-phase clock signals each having 1/K the frequency or data rate of each of input data bit streams $d_{in1}$ and $d_{in2}$ but having the same frequency or data rate as each of the other K individual streams obtained by demultiplexing the respective one of the input data bit streams $d_{in1}$ or $d_{in2}$) where each phase of each clock signal in a given clock cycle triggers a corresponding sampler to sample a corresponding bit from a corresponding one of the K individual data bit streams obtained by demultiplexing the respective input data bit stream $d_{in1}$ or $d_{in2}$. Based on the detected phase difference (if any) between $d_{in1}$ and $Clk_1$, phase detector 102 may generate one or more phase correction signals that are then output to charge pump 106. Similarly, based on the detected phase difference (if any) between $d_{in2}$ and $Clk_2$, phase detector 104 may generate one or more phase correction signals that are then output to charge pump 108. In particular embodiments, based on the phase correction signals received from phase detectors 102 and 104, charge pumps 106 and 108 effect the raising, lowering, or maintaining of a responding current $I_{CP}$, which is filtered by loop filter 110. Loop filter 110 generally affects the dynamic behavior of the feedback loop and filters out any high frequency noise associated with the current $I_{CP}$ output from the charge pumps 106 and 108. Loop filter 110 outputs a control voltage $V_{CTRL}$ based on $I_{CP}$ that controls the frequency and phase of the clock signal $Clk_0$, and consequently the clock signals $Clk_1$ and $Clk_2$, output from VCO 112 (thereby forming the primary feedback loop mentioned above). In such a manner, CDR 100 is configured to receive input data bit streams $d_{in1}$ and $d_{in2}$, and over a number of iterations, generate clock signals $Clk_1$ and $Clk_2$ that match the frequencies and phases of input data bit streams $d_{in1}$ and $d_{in2}$ (or demultiplexed streams generated therefrom) as described in further detail below.

In particular embodiments, phase detectors 102 and 104 receive input data bit streams $d_{in1}$ and $d_{in2}$, respectively, and essentially compare the phases of the data bits in input data bit streams $d_{in1}$ and $d_{in2}$ to the phases of clock signals $Clk_1$ and $Clk_2$, respectively. For example, if phase detector 102 detects a phase difference between input data bit stream $d_{in1}$ and clock signal $Clk_1$ (or, in embodiments in which $d_{in1}$ is demultiplexed into K individual streams, a phase difference between the K-phase clock signal $Clk_1$ and the K individual streams obtained from demultiplexing $d_{in1}$), phase detector 102 may generate a phase correction signal to ultimately effect an adjustment in the phase of clock signal $Clk_1$. The phase correction signals generated by phase detector 102 may be implemented by transmitting or asserting one of two signals, an up signal ("$UP_1$") or a down signal ("$DN_1$") where an $UP_1$ signal is used to increase the current $I_{CP}$ to thereby increase the phase or frequency of clock signal $Clk_1$ and a $DN_1$ signal is used to decrease the current $I_{CP}$ to thereby decrease the phase or frequency of clock signal $Clk_1$. Generally, the phase correction signals $UP_1$ and $DN_1$ have equal but opposite effects on the current $I_{CP}$; that is, $UP_1$ may increase the current $I_{CP}$ by the same magnitude that $DN_1$ would decrease it. Similarly, if phase detector 104 detects a phase difference between input data bit stream $d_{in2}$ and clock signal $Clk_2$ (or, in embodiments in which $d_{in2}$ is demultiplexed into K individual streams, a phase difference between the K-phase clock signal $Clk_2$ and the K individual streams obtained from demultiplexing $d_{in2}$), phase detector 104 may generate a phase correction signal to ultimately effect an adjustment in the phase of clock signal $Clk_2$. The phase correction signals generated by phase detector 104 may be implemented by transmitting or asserting one of two signals, an up signal ("$UP_2$") or a down signal ("$DN_2$") where an $UP_2$ signal is used to increase the current $I_{CP}$ to thereby increase the phase or frequency of clock signal $Clk_2$ and a $DN_2$ signal is used to decrease the current $I_{CP}$ to thereby decrease the phase or frequency of clock signal $Clk_2$. Again, generally, the phase correction signals $UP_2$ and $DN_2$ have equal but opposite effects on the current $I_{CP}$; that is, $UP_2$ may increase the current $I_{CP}$ by the same magnitude that $DN_2$ would decrease it. As will be described in more detail below, there may be instances where phase detector 102 and phase detector 104 transmit opposing signals. For example, phase detector 102 may output an $UP_1$ signal while phase detector 104 outputs a $DN_2$ signal, or conversely, phase detector 102 outputs a $DN_1$ signal while phase detector 104 outputs an $UP_2$ signal. In particular embodiments, the phase correction signals $UP_1$ and $UP_2$ have equal effects on the current $I_{CP}$. Similarly, the phase correction signals $DN_1$ and $DN_2$ have equal effects on the current $I_{CP}$. Hence, if phase detector 102 asserts $UP_1$ while phase detector 104 asserts $DN_2$, or similarly, phase detector 102 asserts $DN_1$ while phase detector 104 asserts $UP_2$, there would be no net increase or decrease in $I_{CP}$ (in this way, phase discrepancies resulting from high frequency noise are averaged out). Likewise, if phase detector 102 asserts $UP_1$ and phase detector 104 asserts $UP_2$, the net increase in $I_{CP}$ may be double that of the increase if only one of $UP_1$ and $UP_2$ was asserted (and neither $DN_1$ nor $DN_2$ was asserted), and similarly, if phase detector 102 asserts $DN_1$ while phase detector 104 asserts $DN_2$, the net decrease in $I_{CP}$ may be double that of the decrease if only one of $DN_1$ and $DN_2$ was asserted (and neither $UP_1$ nor $UP_2$ was asserted). In particular embodiments, phase detector 102 asserts only one of, or none of, the phase correction signals $UP_1$ and $DN_1$ at any particular time. Similarly, in particular embodiments, phase detector 104 asserts only one of, or none of, the phase correction signals $UP_2$ and $DN_2$ at any particular time.

Based on the control voltage $V_{CTRL}$ output from loop filter 110, VCO 112 generates the clock signal $Clk_0$, which may be a multiphase (e.g., K-phase) clock signal in some embodiments. In particular embodiments, the phase of clock signal $Clk_0$ is effectively locked to the middle of the phase offset between the phase of $d_{in1}$ and the phase of $d_{in2}$. In particular embodiments, loop filter 110 is, or comprises, a low-pass filter (or low pass filter circuit). In particular embodiments, the clock signal $Clk_0$ is output to each of phase interpolators 114 and 116.

In some example embodiments, each of phase interpolators 114 and 116 is an analog phase interpolator, in which case each of the phase interpolators 114 and 116 is controlled by an analog voltage $V_{PI}$ or $-V_{PI}$ (i.e., $-V_{PI}$ is the complement of $V_{PI}$), respectively, output from low-pass filter (LPF) 118. In other example embodiments, each of phase interpolators 114 and 116 is a digital phase interpolator, in which case each of phase interpolators 114 and 116 is controlled by a digital code $PI_{CODE}$ or $-PI_{CODE}$, respectively, output from LPF 118. Whichever the case (analog or digital), the controls ($V_{PI}$ and $-V_{PI}$ or $PI_{CODE}$ and $-PI_{CODE}$) cause the respective phase interpolators 114 or 116 to skew the phase of $Clk_0$ by the same magnitude, but in opposite directions, to generate the respective clock signals $Clk_1$ and $Clk_2$. That is, for example, if the value of $V_{PI}$ is such that it causes phase interpolator 114 to skew the phase of $Clk_0$ (or phases if $Clk_0$ and $Clk_1$ are multiphase clock signals) forward to generate $Clk_1$ (e.g., to advance the phase(s) of $Clk_1$ relative to $d_{in1}$), then the value of $-V_{PI}$ consequently causes phase interpolator 116 to skew the phase of $Clk_0$ (or phases if $Clk_0$ and $Clk_2$ are multi-phase clock signals) backward to generate $Clk_2$ (e.g., to delay the phase(s) of $Clk_2$ relative to $d_{in2}$) by the same phase magnitude, and vice versa.

In particular embodiments, to avoid interdependence between the convergence of each of the local loops, one of the inputs to CDR 100 is enabled only after the primary loop has converged. By way of example, this may be achieved by enabling phase detector 104 (or alternately phase detector 102) only after the primary loop converges; that is, when the phase of the clock signal $Clk_1$ matches that of the input data bit stream $d_{in1}$ (or, in embodiments in which $d_{in1}$ is demultiplexed into K individual streams, the phases of the K-phase clock signal $Clk_1$ match the phases of the data bits in the K individual streams obtained from demultiplexing $d_{in1}$).

In particular embodiments, LPF 118 receives as input the $UP_1$, $DN_1$, $UP_2$, and $DN_2$ output from the phase detectors 102 and 104 and generates the complementary analog voltages $V_{PI}$ and $-V_{PI}$ or complementary digital codes $PI_{CODE}$ and $-PI_{CODE}$ depending on whether the phases interpolators 114 and 116 are analog or digital, respectively. More particularly, in one example embodiment, LPF 118 averages the two differences ($UP_1-DN_1$ and $UP_2-DN_2$); that is averages the expression (1) below.

$$UP_1+UP_2-DN_1-DN_2 \tag{1}$$

In this way, in such embodiments, by using the symmetry of the phase interpolators 114 and 116 with respect to their respective control inputs (i.e., either analog voltages $V_{PI}$ and $-V_{PI}$ or digital codes $PI_{CODE}$ and $-PI_{CODE}$), the phase of the clock signal $Clk_0$ generated by VCO 112 is guaranteed to be the average of the phases of the clock signals $Clk_1$ and $Clk_2$. Furthermore, the phase offset between $Clk_1$ and $Clk_2$ is guaranteed, upon loop convergence, to equal the phase offset between $d_{in1}$ and $d_{in2}$, and thus compensate for the phase offset between $d_{in1}$ and $d_{in2}$.

Figure 4A:
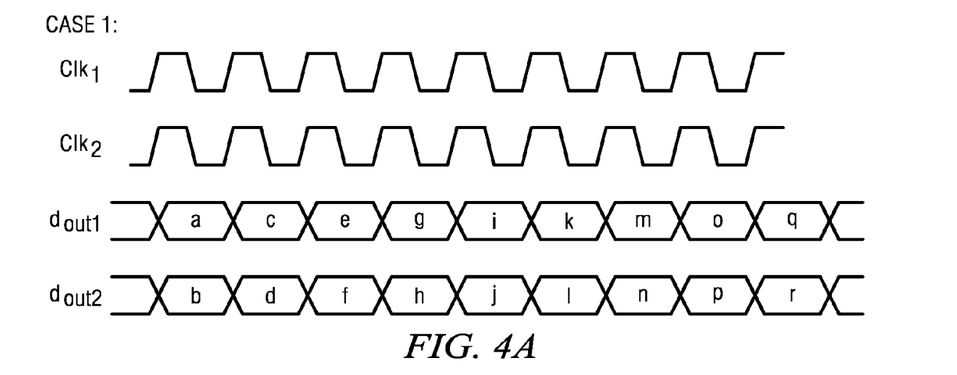
FIGS. 4A-4C illustrate example lock conditions that may arise when the CDR architecture of FIG. 1 performs clock and data recovery on the example input data streams of FIG. 3.
Figure 4B:
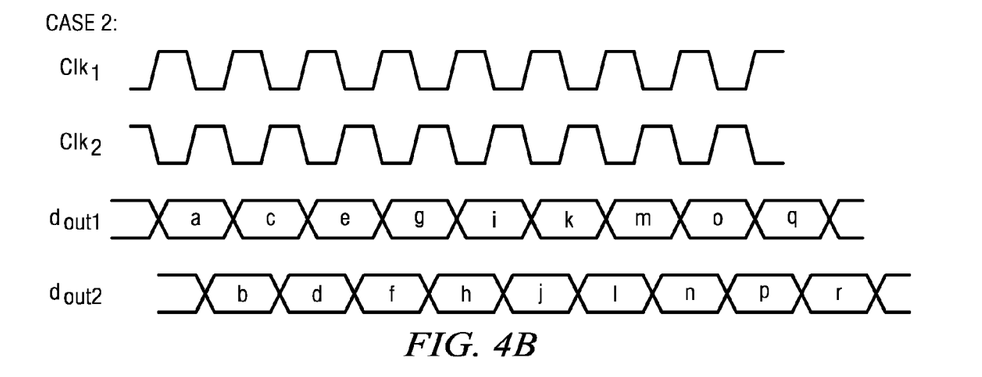
Figure 4C:
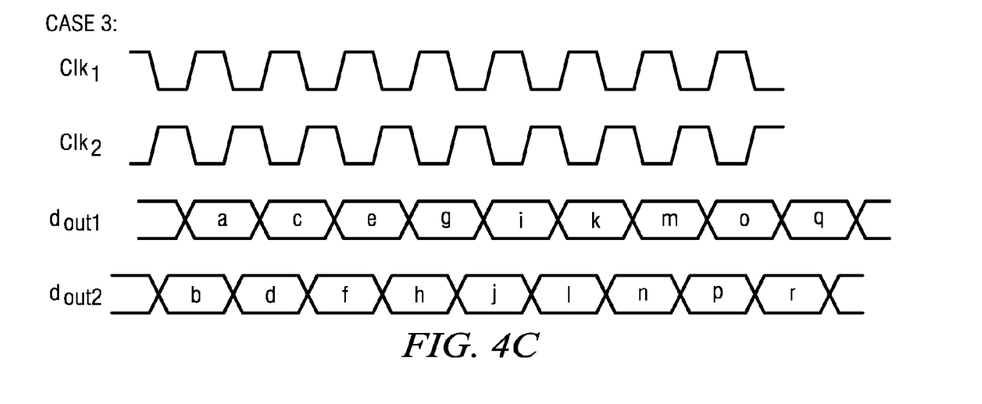

In particular embodiments, phase interpolators 114 and 116 are each configured to have a phase interpolation range less than $\pm UI/4$ (where UI is the unit interval of the input data bits in the input data bit streams $d_{in1}$ or $d_{in2}$). In such embodiments, the total relative phase offset between $Clk_1$ and $Clk_2$ is less than $\pm UI/2$. Configuring the phase interpolators 114 and 116 to have a range of less than $\pm UI/4$ is done in particular embodiments to avoid an incorrect ordering of bits in the recovered output data bit streams $d_{out1}$ and $d_{out2}$, which otherwise may occur in some implementations if in the process of CDR lock (i.e., loop convergence and locking of the phases of the clock signals $Clk_1$ and $Clk_2$ to the input bit streams $d_{in1}$ and $d_{in2}$, respectively), the phase interpolators 114 and 116 lock to adjacent input bits as in cases 2 and 3 illustrated in FIGS. 4B and 4C. If such different cases (i.e., cases 2 and 3) were allowed to exist, a relatively complicated control circuit would be needed in such embodiments to detect the occurrence of cases 2 or 3, and reset CDR 100 to guarantee a proper locking as in cases 1, which FIG. 4A illustrates. Moreover, by construction, the ordering of the recovered bits in each of the recovered bit streams is known relative to the other recovered bit streams, and hence, recombining the recovered bits is trivial.

As described earlier, in particular embodiments, CDR 100 not only recovers the clock and individual data from input data bit streams $d_{in1}$ and $d_{in2}$, but also recombines the recovered bits from the two input data bit streams $d_{in1}$ and $d_{in2}$; that is, determines which bits from $d_{in1}$ and $d_{in2}$ correspond to the same corresponding symbols from the DQPSK symbol stream from which the bits in input data bit streams $d_{in1}$ and $d_{in2}$ were obtained and outputs these bits in the proper order as they were in the DQPSK symbol stream (e.g., a, b, c, d, e, f, g, and so on). Thus, in particular embodiments, CDR 100 further includes a data combiner that interleaves, or combines the bits from recovered data bit streams $d_{out1}$ and $d_{out2}$ and generates one or more output streams in which the values and ordering of the bits in the one or more output streams correspond to the values and ordering of the bits in the DQPSK symbol stream. By way of example, the data combiner may combine recovered data bit streams $d_{out1}$ and $d_{out2}$ and output the combined bits onto an output bus having any number of wires (e.g., 1, 2, 4, 8, etc.) each carrying an output stream that comprises respective bits from the combined recovered data bit streams $d_{out1}$ and $d_{out2}$. In one example embodiment, the data combiner requires no actual hardware, but bundles the recovered data $d_{out1}[K:1]$ and $d_{out2}[K:1]$ to a single stream or bus $d_{out}[2K:1]$ such that $d_{out}[2i-1]=d_{out1}[i]$, and $d_{out}[2i]=d_{out2}[i]$, for $i=1 \ldots K$.

Figure 5:
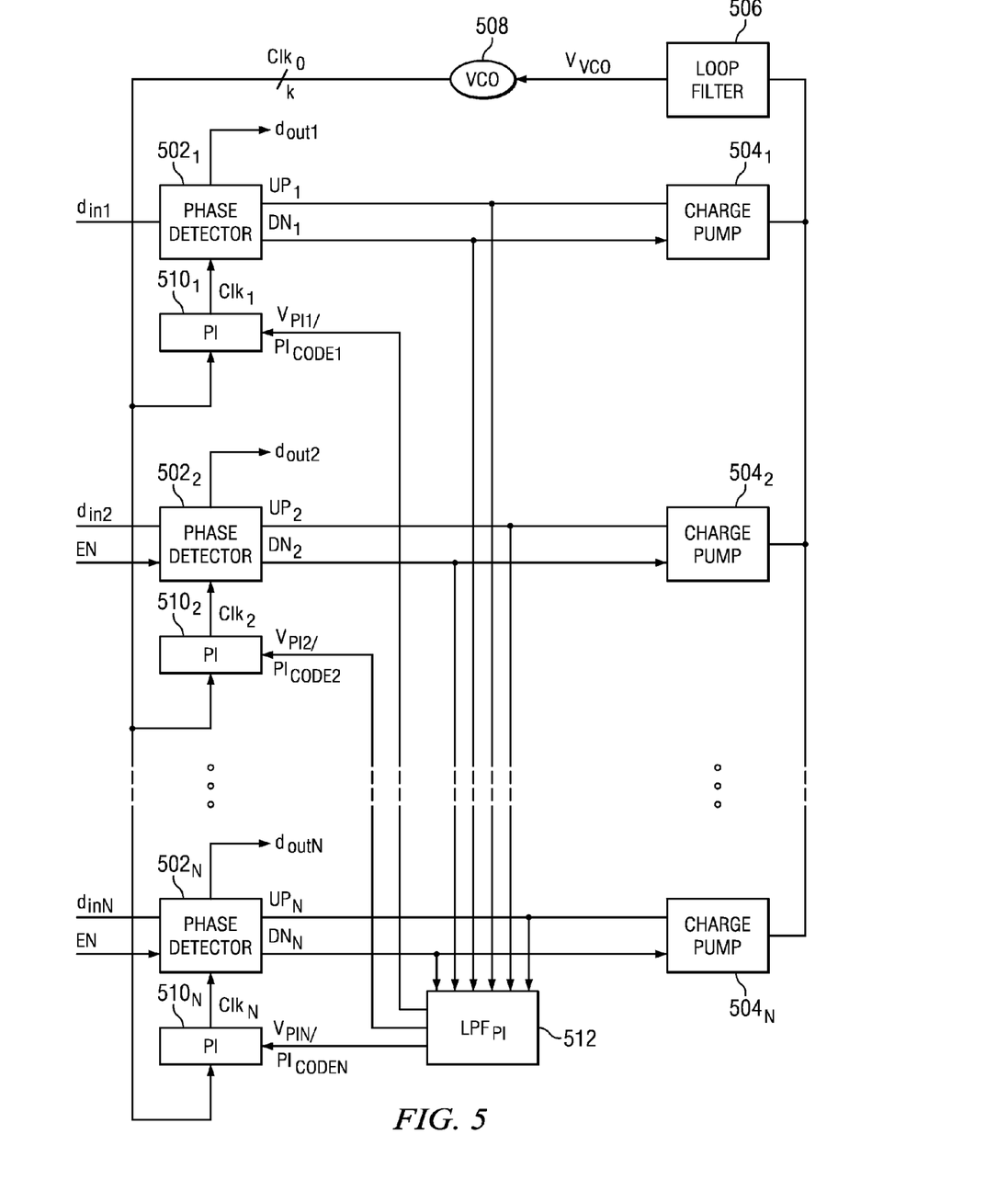
FIG. 5 illustrates an example variation of the CDR architecture of FIG. 1 generalized to N input data streams.

FIG. 5 illustrates an example CDR 500 that is a variation of the CDR architecture of FIG. 1 generalized to N input data streams $d_{in1}$, $d_{in2}$, ... $d_{inN}$. CDR 500 comprises N phase detectors $502_1$ through $502_N$, each of which is configured to receive a corresponding one of the N input data bit streams and to recover the respective data bits in the respective one of the N input data bit streams to generate a respective one of the recovered data bit streams $d_{out1}$, $d_{out2}$, ... $d_{outN}$. As described above, each of phase detectors $502_1$ through $502_N$ may demultiplex the respective one of the input data bit streams it receives into K individual streams. Thus, in alternate notation, for example, $d_{out1}$ may be written as $D_{out1}[1, N+1, 2N+1, \ldots (K-1)N+1]$, while $d_{out2}$ may be written as $D_{out2}[2, N+2, 2N+2, \ldots (K-1)N+2]$, and so on with $d_{outN}$ written as $D_{outN}[N, 2N, 3N, \ldots KN]$. CDR 500 further comprises charge pumps $504_1$ through $504_N$, loop filter 506, VCO 508, phase interpolators $510_1$ through $510_N$, and low-pass filter 512, each of which may be configured similarly as described above but modified as illustrated in FIG. 5 and as described below.

Figure 6:
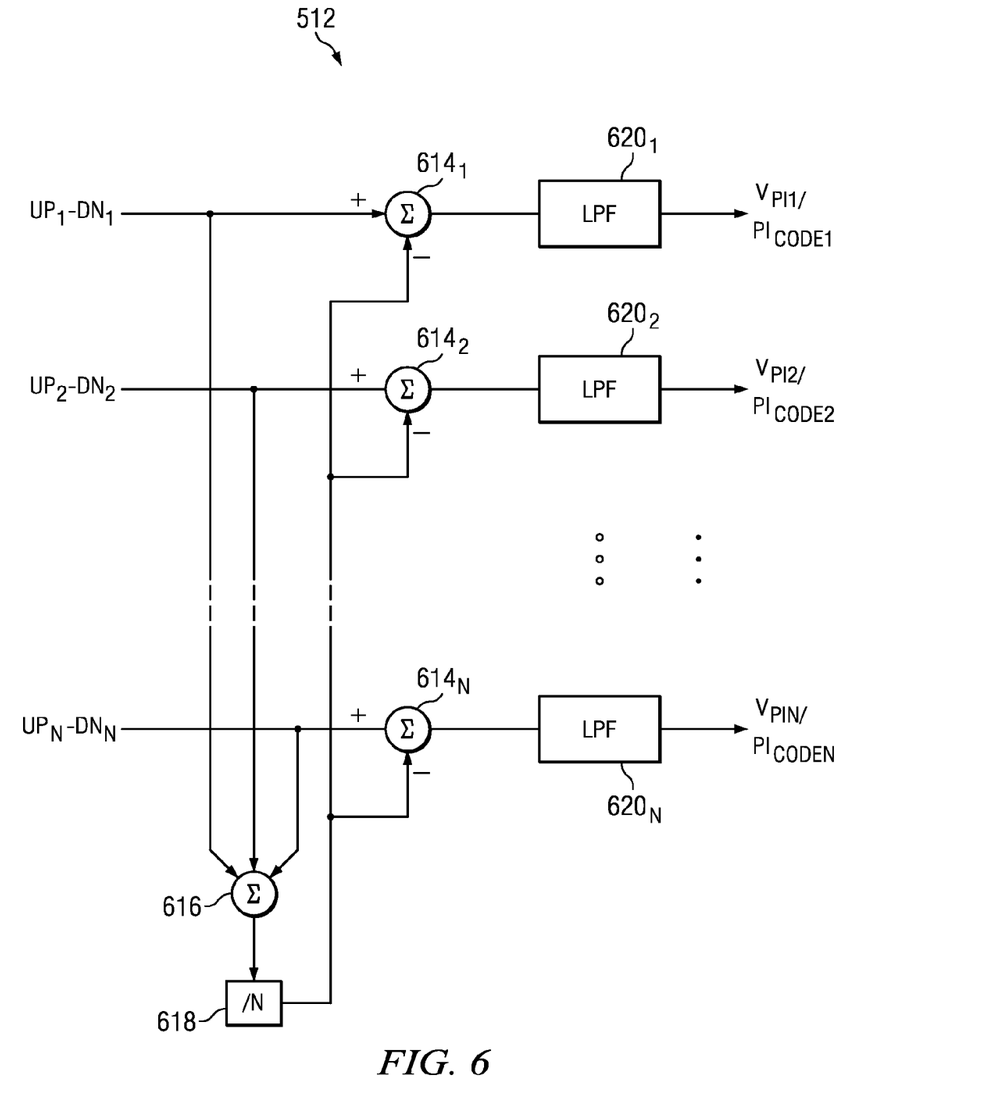
FIG. 6 illustrates an example low pass filtering architecture suitable for use in the CDR architecture of FIG. 5.

In particular embodiments, the controls $V_{PI1}$ through $V_{PIN}$ (for analog phase interpolators) or $PI_{CODE1}$ through $PI_{CODEN}$ (for digital phase interpolators) for each of the phase interpolators $510_1$ through $510_N$, respectively, are obtained by LPF 512 by filtering the difference of the corresponding UP and DN phase correction signals generated by the respective one of the phase detectors $502_1$ through $502_N$ (e.g., $UP_1-DN_1$ for phase interpolator $510_1$), respectively, attenuated by the average of the differences of the UP and DN phase correction signals received by LPF 512 from all of the phase detectors $502_1$ through $502_N$. By way of example, FIG. 6 illustrates an example N-input/N-output low pass filtering architecture or circuit suitable for use as LPF 512 for performing the filtering function just described. In the embodiment illustrated in FIG. 6, LPF 512 includes adders $614_1$ through $614_N$ that receive the respective phase correction signal differences from the respective phase detectors $502_1$ through $502_N$. LPF 512 further includes adder 616 that receives all of the aforementioned phase correction signal differences and that outputs the sum to divider 618, which divides the sum by N. Adders $614_1$ through $614_N$ each then subtract the divided sum (the average) from the respective phase correction signal difference received from the respective one of the phase detectors. Each of the adders $614_1$ through $614_N$ then outputs the result to a corresponding one of the low-pass filters $620_1$ through $620_N$, which generate and output the respective analog or digital controls to the respective phase interpolators $510_1$ through $510_N$. In this way, the common mode of the inputs to all individual channels is guaranteed to be zero. Therefore, if the individual filters $620_1$ through $620_N$ have no poles at DC or the proper initialization is applied in the case that one or more of these filters has poles at DC, the phase interpolator analog or digital controls will maintain the same property. In this manner, the phase of the clock signal $Clk_0$ generated by VCO 508 is again guaranteed to be the average of all the clock signals $Clk_1$ through $Clk_N$ output from the respective phase interpolators $510_1$ through $510_N$, respectively.

The described embodiments offer one or more advantages over conventional CDR circuits. In particular, the described embodiments do not require a full-rate architecture. Furthermore, the described embodiments may utilize a single VCO, which may reduce the area and power consumption required by the CDR architecture as well as eliminate the potentially damaging coupling that may otherwise occur between VCOs in CDR architectures that utilize multiple VCOs.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

The invention claimed is:

1. A method comprising:
receiving by a primary loop N input data bit streams, each one of the N input data bit streams comprising input data bits at an input data rate, wherein the value of N is greater than zero;
generating by the primary loop a recovered clock signal based on the input data bits in the N input data bit streams, the recovered clock signal having a clock frequency and a recovered clock phase;
generating by each of N sub-loops a clock signal for a corresponding one of the N input data bit streams based on the recovered clock signal having the clock frequency and a respective phase at a respective phase offset relative to the recovered clock phase and such that the recovered phase of the recovered clock signal is an average of N phases of N clock signals generated by the N respective sub-loops;
detecting by the primary loop a phase difference between each of the N input data bit streams and the respective one of the N clock signals generated by the corresponding one of the N sub-loops; and
adjusting the phases of the N clock signals to substantially eliminate the respective phase differences, the adjusting comprising shifting one or more of the N respective clock phase offsets of the N clock signals such that each of the N clock signals is locked to the input data bits in the respective one of the N input data bit streams.

2. The method of claim 1, wherein:
the value of N is 2;
a first one of the N input data bit streams has a first clock phase and a first clock phase offset relative to the recovered clock phase;
a second one of the N input data bit streams has a second clock phase and a second clock phase offset relative to the recovered clock phase;
the second phase offset is in the opposite direction as the first phase offset and has the same magnitude as the first phase offset such that the recovered phase of the recovered clock signal is the average of the phases of the first and second clock signals; and
adjusting the first and second phases of the first and second clock signals, respectively, to substantially eliminate the first and second phase differences comprises shifting the first phase offset and the second phase offset such that the first phase offset is shifted by the same magnitude but opposite direction as the second phase offset is shifted such that the first clock signal is locked to the input data bits in the first one of the input data bit streams and the second clock signal is locked to the input data bits in the second one of the input data bit streams.

3. The method of claim 1, further comprising demultiplexing each of the N input data bit streams into K demultiplexed data bit streams, wherein the value of K is greater than zero.

4. The method of claim 3, wherein each of the recovered clock signal and the N clock signals generated by the N sub-loops is a K-phase clock signal, each phase of each of the N generated clock signals being used to sample a corresponding one of the K demultiplexed data bit streams from the respective one of the N input data bit streams.

5. A method comprising:
receiving by a first phase detection circuit a first input data bit stream comprising first input data bits at an input data rate;
generating by a first phase interpolator circuit a first clock signal having a clock frequency and a first clock phase based on a first phase interpolator control signal and a base clock signal, the base clock signal having the clock frequency and a base clock phase;
sampling by the first phase detection circuit the first input data stream based on the first clock signal to generate a first recovered data bit stream comprising first recovered data bits recovered by sampling the respective first input data bits;
detecting by the first phase detection circuit a first phase difference between the first input data bits and the first clock signal;
receiving by a second phase detection circuit a second input data bit stream comprising second input data bits at the input data rate;
generating by a second phase interpolator circuit a second clock signal having the clock frequency and a second clock phase based on a second phase interpolator control signal and the base clock signal;
sampling by the second phase detection circuit the second input data stream based on the second clock signal to generate a second recovered data bit stream comprising second recovered data bits recovered by sampling the respective second input data bits;
detecting by the second phase detection circuit a second phase difference between the second input data bits and the second clock signal;
adjusting the first and second phases of the first and second clock signals, respectively, to substantially eliminate the first and second phase differences, the adjusting comprising:
generating by the first phase detection circuit one or more first phase-correction signals based on the first phase difference;
generating by the second phase detection circuit one or more second phase-correction signals based on the second phase difference;
generating by one or more charge pumps a current based on the one or more first phase-correction signals and the one or more second-phase correction signals;
generating by a first filter a control signal based on the current generated by the one or more charge pumps;
generating by a clock signal generator circuit the base clock signal based on the control signal; and
generating by a second filter the first and second phase interpolator control signals for the first and second phase interpolator circuits, respectively, based on a function of the first phase-correction signals and the second phase-correction signals;
wherein:
the first phase interpolator control signal causes the first phase interpolator circuit to skew the phase of the first clock signal to advance or delay the first phase of the first clock signal to substantially eliminate the phase offset between the first phase and the first input data bit stream; and
the second phase interpolator control signal causes the second phase interpolator circuit to skew the phase of the second clock signal to advance or delay the second phase of the second clock signal to substantially eliminate the phase offset between the second phase and the second input data bit stream.

6. The method of claim 5, wherein:
the first phase interpolator control signal is complementary to the second phase interpolator control signal such that the first phase interpolator control signal causes the first phase interpolator to skew the first phase of the first clock signal by an equal amount as the second phase interpolator control signal causes the second phase interpolator to skew the second phase of the second clock signal but in an opposite direction; and
the base phase of the base clock signal is an average of the first and second phases.

7. The method of claim 6, wherein the first input data bits in the first input data bit stream and the second input data bits in the second input data bit stream were previously decoded from a single symbol stream, each symbol in the symbol stream comprising at least a first symbol bit and a second symbol bit, each first input data bit comprising one of the first symbol bits and each second input data bit comprising one of the second symbol bits.

8. The method of claim 7, wherein the first and second symbol bits comprise Differential Quadrature Phase Shift Keying (DQPSK)-modulated data bits.

9. The method of claim 7, further comprising combining the first and second recovered data bit streams to reconstruct the symbol stream.

10. The method of claim 5, further comprising demultiplexing the first input data bit stream into K first demultiplexed data bit streams and demultiplexing the second input data bit stream into K second demultiplexed data bit streams, wherein the value of K is greater than zero.

11. The method of claim 10, wherein:
each of the base clock signal, the first clock signal, and the second clock signal is a K-phase clock signal, each phase of the first clock signal being used to sample a corresponding one of the K first demultiplexed data bit streams, each phase of the second clock signal being used to sample a corresponding one of the K second demultiplexed data bit streams;
each of the K first demultiplexed data bit streams and K second demultiplexed data bit streams are at 1/K the input data rate; and
the clock frequency is at 1/K the input data rate.

12. The method of claim 11, wherein each of the first and second recovered data bit streams comprises K data bit streams obtained by sampling the corresponding ones of the K first demultiplexed data bit streams and K second demultiplexed data bit streams.

13. The method of claim 5, wherein:
each of the phase interpolator circuits is configured to have a phase interpolation range of less than ±UI/4, where UI is the unit interval of the input data bits in the input data bit streams; and
the total relative phase offset between the first phase and the second phase is less than ±UI/2.

14. A circuit comprising:
a primary loop configured to:
receive N input data bit streams, each one of the N input data bit streams comprising input data bits at an input data rate, wherein the value of N is greater than zero;
generate a recovered clock signal based on the input data bits in the N input data bit streams, the recovered clock signal having a clock frequency and a recovered clock phase; and
N sub-loops, each of the N sub-loops being configured to generate a clock signal for a corresponding one of the N input data bit streams based on the recovered clock signal having the clock frequency and a respective phase at a respective phase offset relative to the recovered clock phase such that the recovered phase of the recovered clock signal is an average of N phases of N clock signals generated by the N respective sub-loops;
wherein the primary loop is further configured to:
detect a phase difference between each of the N input data bit streams and the respective one of the N clock signals generated by the corresponding one of the N sub-loops; and
adjust the phases of the N clock signals to substantially eliminate the phase differences by shifting one or more of the N respective clock phase offsets of the N clock signals such that each of the N clock signals is locked to the input data bits in the respective one of the N input data bit streams.

15. The circuit of claim 14, wherein:
the value of N is 2;
a first one of the N input data bit streams has a first clock phase and a first clock phase offset relative to the recovered clock phase;
a second one of the N input data bit streams has a second clock phase and a second clock phase offset relative to the recovered clock phase;
the second phase offset is in the opposite direction as the first phase offset and has the same magnitude as the first phase offset such that the recovered phase of the recovered clock signal is the average of the phases of the first and second clock signals; and
to adjust the first and second phases of the first and second clock signals, respectively, to substantially eliminate the first and second phase differences, the circuit is configured to shift the first phase offset and the second phase offset such that the first phase offset is shifted by the same magnitude but opposite direction as the second phase offset is shifted such that the first clock signal is locked to the input data bits in the first one of the input data bit streams and the second clock signal is locked to the input data bits in the second one of the input data bit streams.

16. The circuit of claim 14, wherein the circuit comprises one or more demultiplexers configured to demultiplex each of the N input data bit streams into K demultiplexed data bit streams, wherein the value of K is greater than zero.

17. The circuit of claim 16, wherein each of the recovered clock signal and the N clock signals generated by the N sub-loops is a K-phase clock signal, each phase of each of the N generated clock signals being used to sample a corresponding one of the K demultiplexed data bit streams from the respective one of the N input data bit streams.

18. A circuit comprising:
a first phase interpolator circuit configured to generate a first clock signal having a clock frequency and a first clock phase based on a first phase interpolator control signal and a base clock signal, the base clock signal having the clock frequency and a base clock phase;
a second phase interpolator circuit configured to generate a second clock signal having the clock frequency and a second clock phase based on a second phase interpolator control signal and the base clock signal;
a first phase detection circuit configured to:
receive a first input data bit stream comprising first input data bits at an input data rate;
sample the first input data stream based on the first clock signal to generate a first recovered data bit stream comprising first recovered data bits recovered by sampling the respective first input data bits;
detect a first phase difference between the first input data bits and the first clock signal; and
generate one or more first phase-correction signals based on the first phase difference;
a second phase detection circuit configured to:
receive a second input data bit stream comprising second input data bits at the input data rate;
sample the second input data stream based on the second clock signal to generate a second recovered data bit stream comprising second recovered data bits recovered by sampling the respective second input data bits;
detect a second phase difference between the second input data bits and the second clock signal; and
generate one or more second phase-correction signals based on the second phase difference;
one or more charge pumps configured to generate a current based on the one or more first phase-correction signals and the one or more second-phase correction signals;
a first filter configured to generate a control signal based on the current generated by the one or more charge pumps;
a clock signal generator configured to generate the base clock signal based on the control signal; and
a second filter configured to generate the first and second phase interpolator control signals for the first and second phase interpolator circuits, respectively, based on a function of the first phase-correction signals and the second phase-correction signals;
wherein:
the first phase interpolator control signal causes the first phase interpolator circuit to skew the phase of the first clock signal to advance or delay the first phase of the first clock signal to substantially eliminate the phase offset between the first phase and the first input data bit stream; and
the second phase interpolator control signal causes the second phase interpolator circuit to skew the phase of the second clock signal to advance or delay the second phase of the second clock signal to substantially eliminate the phase offset between the second phase and the second input data bit stream.

19. The circuit of claim 18, wherein:
the first phase interpolator control signal is complementary to the second phase interpolator control signal such that the first phase interpolator control signal causes the first phase interpolator to skew the first phase of the first clock signal by an equal amount as the second phase interpolator control signal causes the second phase interpolator to skew the second phase of the second clock signal but in an opposite direction; and
the base phase of the base clock signal is an average of the first and second phases.

20. The circuit of claim 19, wherein the first input data bits in the first input data bit stream and the second input data bits in the second input data bit stream were previously decoded from a single symbol stream, each symbol in the symbol stream comprising at least a first symbol bit and a second symbol bit, each first input data bit comprising one of the first symbol bits and each second input data bit comprising one of the second symbol bits.

21. The circuit of claim 20, wherein the first and second symbol bits comprise Differential Quadrature Phase Shift Keying (DQPSK)-modulated data bits.

22. The circuit of claim 20, further comprising a data combiner configured to combine the first and second recovered data bit streams to reconstruct the symbol stream.

23. The circuit of claim 18, further comprising one or more demultiplexers configured to demultiplex the first input data bit stream into K first demultiplexed data bit streams and demultiplex the second input data bit stream into K second demultiplexed data bit streams, wherein the value of K is greater than zero.

24. The circuit of claim 23, wherein:
each of the base clock signal, the first clock signal, and the second clock signal is a K-phase clock signal, each phase of the first clock signal being used to sample a corresponding one of the K first demultiplexed data bit streams, each phase of the second clock signal being used to sample a corresponding one of the K second demultiplexed data bit streams;
each of the K first demultiplexed data bit streams and K second demultiplexed data bit streams are at 1/K the input data rate; and
the clock frequency is at 1/K the input data rate.

25. The circuit of claim 24, wherein each of the first and second recovered data bit streams comprises K data bit streams obtained by sampling the corresponding ones of the K first demultiplexed data bit streams and K second demultiplexed data bit streams.

26. The circuit of claim 18, wherein:
each of the phase interpolator circuits is configured to have a phase interpolation range of less than $\pm UI/4$, where UI is the unit interval of the input data bits in the input data bit streams; and
the total relative phase offset between the first phase and the second phase is less than $\pm UI/2$.

* * * * *

UNITED STATES PATENT AND TRADEMARK OFFICE
CERTIFICATE OF CORRECTION

| | | |
|---|---|---|
| PATENT NO. | : 8,139,701 B2 | Page 1 of 1 |
| APPLICATION NO. | : 12/851252 | |
| DATED | : March 20, 2012 | |
| INVENTOR(S) | : Nikola Nedovic | |

It is certified that error appears in the above-identified patent and that said Letters Patent is hereby corrected as shown below:

In the Claims

Claim 1, Col. 9, Ln. 32: After "the" and before "phases" insert --N--.

Signed and Sealed this
Twenty-third Day of September, 2014

Michelle K. Lee
*Deputy Director of the United States Patent and Trademark Office*